United States Patent [19]
Watanabe et al.

[11] Patent Number: 5,886,473
[45] Date of Patent: Mar. 23, 1999

[54] SURFACE WAVE PLASMA PROCESSING APPARATUS

[75] Inventors: Seiichi Watanabe; Masahiro Sumiya; Muneo Furuse; Hitoshi Tamura, all of Kudamatsu, Japan

[73] Assignee: Hitachi, Ltd., Tokyo, Japan

[21] Appl. No.: 921,364

[22] Filed: Aug. 29, 1997

[30] Foreign Application Priority Data

Sep. 2, 1996 [JP] Japan .................................. 8-231625

[51] Int. Cl.$^6$ ...................................................... H05H 1/46
[52] U.S. Cl. .................. 315/111.21; 315/111.41; 315/111.71
[58] Field of Search ............................ 315/111.21–111.91

[56] References Cited

U.S. PATENT DOCUMENTS 5,466,991  11/1995  Berry ................................. 315/111.41
5,646,489  7/1997  Kakehi et al. ..................... 315/111.21

Primary Examiner—David Mis
Attorney, Agent, or Firm—Antonelli, Terry, Stout & Kraus, LLP

[57] ABSTRACT

A coaxial passage for supplying microwaves is vertically provided over a dielectric window forming part of a processing chamber, and a conductor plate for transmitting the microwaves is arranged over the dielectric window which is positioned on the outer circumference of the coaxial passage. A microwave transmission passage can be formed between the surface of a plasma so produced as to have a critical electron density $n_c$, and the conductor plate thereby to transmit microwaves without any reflection along the dielectric window uniformly from the center to the outer circumference.

5 Claims, 5 Drawing Sheets

SURFACE WAVE PLASMA PROCESSING APPARATUS

BACKGROUND OF THE INVENTION

The present invention relates to a plasma processing apparatus and, more particularly, to a surface wave plasma processing apparatus which is suited for etching a sample, such as a semiconductor element substrate having a resist used as a mask, with a plasma and for ashing the same to remove the resist.

In the magnetic-fieldless microwave plasma processing apparatus which uses microwaves, but has no external magnetic field for producing a main plasma, as disclosed in Japanese Laid Open Patent No. 83337/1991, a waveguide tube having a square or circular section is provided vertically with respect to a dielectric window of quartz through which the microwaves are introduced. Generally when the microwaves are introduced into a magnetic-fieldless plasma, it is known that microwaves having an angular frequency $\omega$ can not be propagated in a plasma having a critical electron density $n_c$, as described in "Purazuma Butsuri Nyomon" (Introduction to Plasma Physics) written by F. F. Chen, translated by Taijiro Uchida and published in 1977 by MARUZEN, where:

$$n_c = m\omega^2/4\pi e^2,$$

in which m is the mass of an electron and e is the electron charge. Microwaves having a frequency or 2.45 GHz cannot be propagated in a plasma having a critical electron density of $7 \times 10^7/cm^3$ or more. In this situation, the plasma is so produced that the plasma seems to adhere to the vicinity (about several mm) of the dielectric window. Therefore, the aforementioned conventional construction having a waveguide tube provided vertically with respect to the dielectric window is made such that microwaves are introduced with the wave fronts of their electric field being generally in parallel with the plasma adhering to the dielectric window.

The aforementioned plasma processing apparatus gives no consideration to the reflection of microwaves from the plasma. When microwaves are introduced such that the wave fronts of their electric field are generally in parallel with the plasma adhering to the dielectric window and having a critical electron density of n, or more, they are reflected by the plasma. In the waveguide tube, therefore, standing waves having an eigenmode, such as a circular mode $TE_{11}$ are generated according to the size and shape of the waveguide tube, as described in "Maikuro-ha Kougaku" (Microwave Engineering) written by Masamitsu Nakajima and published in 1975 by MORIKITA SHUPPAN. Since the distribution of the plasma to be produced agrees with the eigenmode of the microwaves, there arises a problem in that the plasma becomes nonuniform in the plane adhering to the dielectric window. Because a plurality of the aforementioned eigenmodes of the microwaves can be present, transition between the eigenmodes is caused by a small disturbance such as the output fluctuation of the microwaves. This causes another problem that the plasma becomes unstable.

SUMMARY OF THE INVENTION

An object of the present invention is to provide a surface wave plasma processing apparatus which makes it possible to effect a uniform plasma processing by producing a plasma stably and uniformly.

In order to achieve the above-specified object, a coaxial passage for supplying microwaves is vertically provided over a dielectric window forming part of a processing chamber; and a conductor plate for transmitting the microwaves is provided over the dielectric window which is positioned on the outer circumference of the coaxial passage.

A coaxial passage for supplying microwaves is vertically provided over a dielectric window forming part of a processing chamber; and a conductor plate for transmitting the microwaves is provided over the dielectric window, which is positioned on the outer circumference of the coaxial passage. As a result, the surface of the plasma to be produced, which is to have a critical electron density of $n_c$ or more, is formed in part of the transmission passage of microwaves, so that microwaves can be propagated in the transmission passage, which is defined by the plasma surface and the conductor plate, along the dielectric window uniformly toward the outer circumference of the coaxial passage. At this time, the wave fronts of the electric field of the microwaves are normal to the plasma surface, so that the microwaves are hardly reflected from the plasma surface. Independently of the eigenmodes of the microwaves, therefore, the plasma can be produced stably and uniformly to effect a uniform plasma processing with excellent reproducibility.

DETAILED DESCRIPTION OF THE PREFERRED EMBODIMENTS

One embodiment of the present invention will be described with reference to FIGS. 1 to 4.

Figure 1:
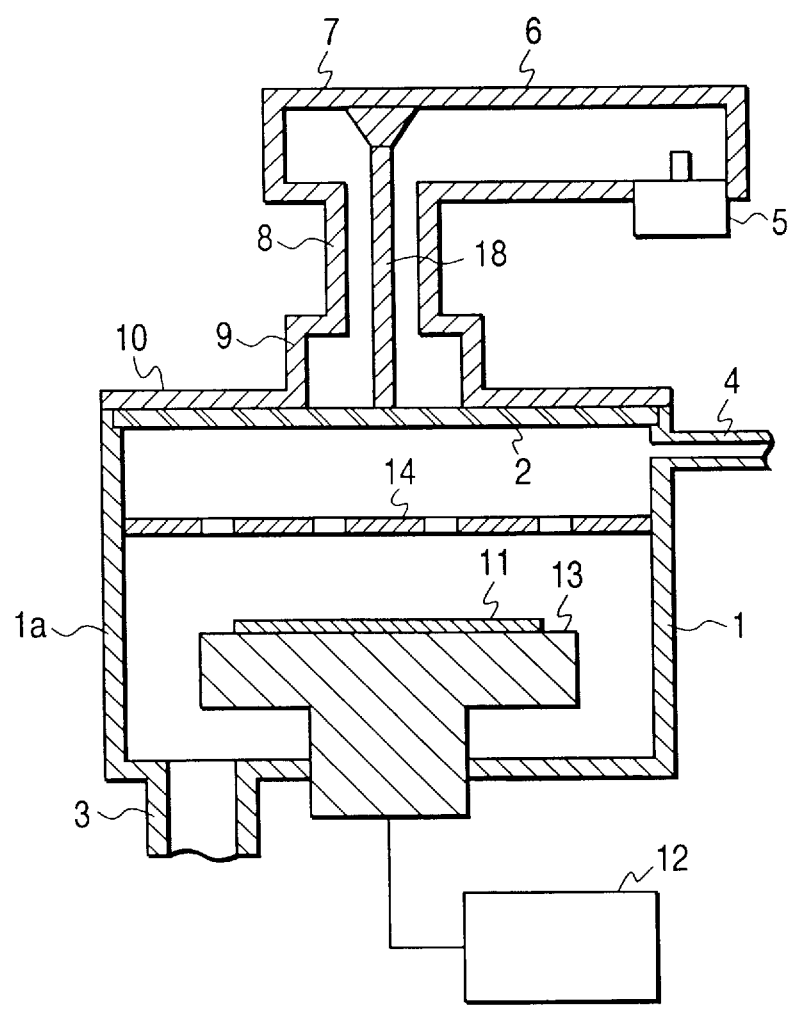
FIG. 1 is a longitudinal section showing an ashing apparatus representing a first embodiment of the present invention.

FIG. 1 shows a microwave ashing apparatus forming one embodiment of a magnetic-fieldless plasma processing apparatus of the present invention. The inside of a processing chamber 1, defined by a container 1a and a quartz window 2, is evacuated through an evacuation port 3 by an (not-shown) evacuating device. After this, an ashing gas is introduced through a gas inlet port 4 into the processing chamber 1 by a (not-shown) gas supply device and the pressure is adjusted to a desired value. Microwaves of 2.45 GHz, oscillated from a magnetron 5, are guided and propagated through a square waveguide tube 6 and then through a coaxial passage 8 connected to a coaxial waveguide converter 7 The coaxial passage 8 is vertically connected to the center of the disc-shaped quartz window 2 through a matching chamber 9 having a step-shaped cylindrical space. A conductor plate 10 is provided over the quartz window 2 on the outer circumference of the coaxial passage 8 and the matching chamber 9. Microwaves are propagated radially outward from the center of the quartz window 2 so that a plasma is produced immediately below the quartz window 2. The gas is dissociated and excited by electrons in the plasma so that a large number of active radicals are produced. A sample 11 to be processed is placed on a sample stage 13, which can be heated and cooled by a temperature controller 12, so that it is ashed by the reaction with radicals which are adjusted in planar distribution while passing through a dispersing plate 14.

Figure 2:
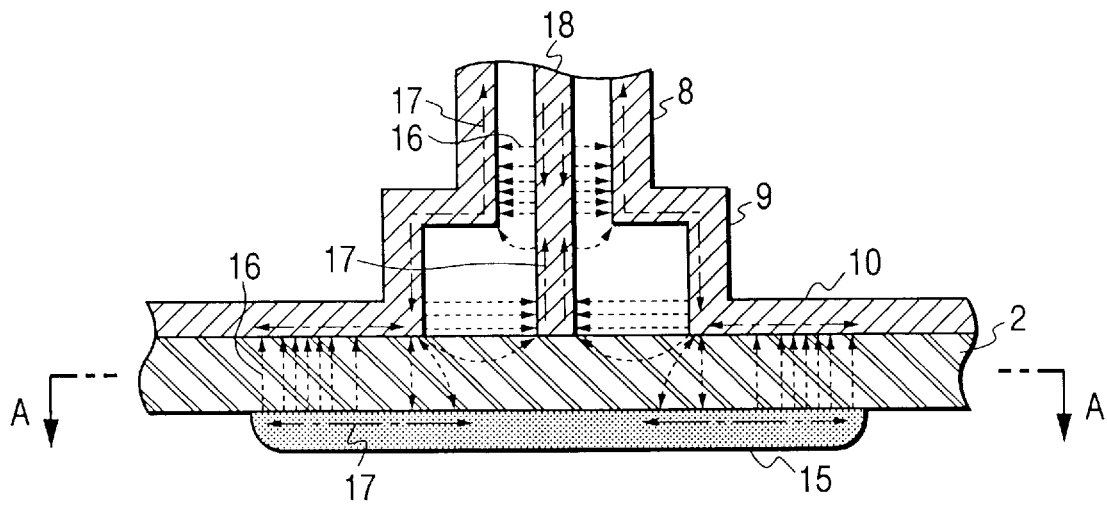
FIG. 2 is a detailed section showing the electric field of a microwave transmitted through the coaxial passage 8, the matching chamber 9 and the quartz window in the first embodiment of the present invention.

In the case of the present embodiment, microwaves are propagated in a square $TE_{10}$ mode through the square waveguide tube 6 and in a coaxial TEM mode having an axially symmetrical radial field distribution through the coaxial passage 8. FIG. 2 schematically shows the electric field 16 of the microwave transmitted through the coaxial passage 8, the matching chamber 9 and the quartz window 2.

First, when microwaves are transmitted through the coaxial passage 8 and the matching chamber 9 and introduced through the quartz window 2 into the processing chamber 1, a plasma 15 having a density of a critical electron density n or more is produced in a disc shape in a region with a spacing of several mm immediately below the quartz window 2. The wave fronts of the microwaves transmitted in the coaxial passage 8 are first enlarged in the matching chamber 9 and then deflected at 90 degrees at the edge of the matching chamber 9, so that they are propagated radially outward from the center of the quartz window 2 through the passage of the region which is sandwiched between the conductor plate 10 and the plasma 15. A surface current 17 flows on the plasma 15, as well as on the surfaces of the coaxial passage 8, the matching chamber 9 and the conductor plate 10. Therefore, the plasma thus produced can be referred to as a "surface wave plasma." When the output of the microwaves introduced is raised, the microwaves are radiated slightly in front of the leading end of the plasma 15 being produced, so that the plasma 15 is slightly enlarged forward. The surface current 17 further flows on the surface of the enlarged plasma 15 to form a transmission passage for the microwaves. As a result, the microwaves are radiated forward so that the plasma 15 is sequentially enlarged with axial symmetry along the surface of the quartz window 2.

Figure 3:
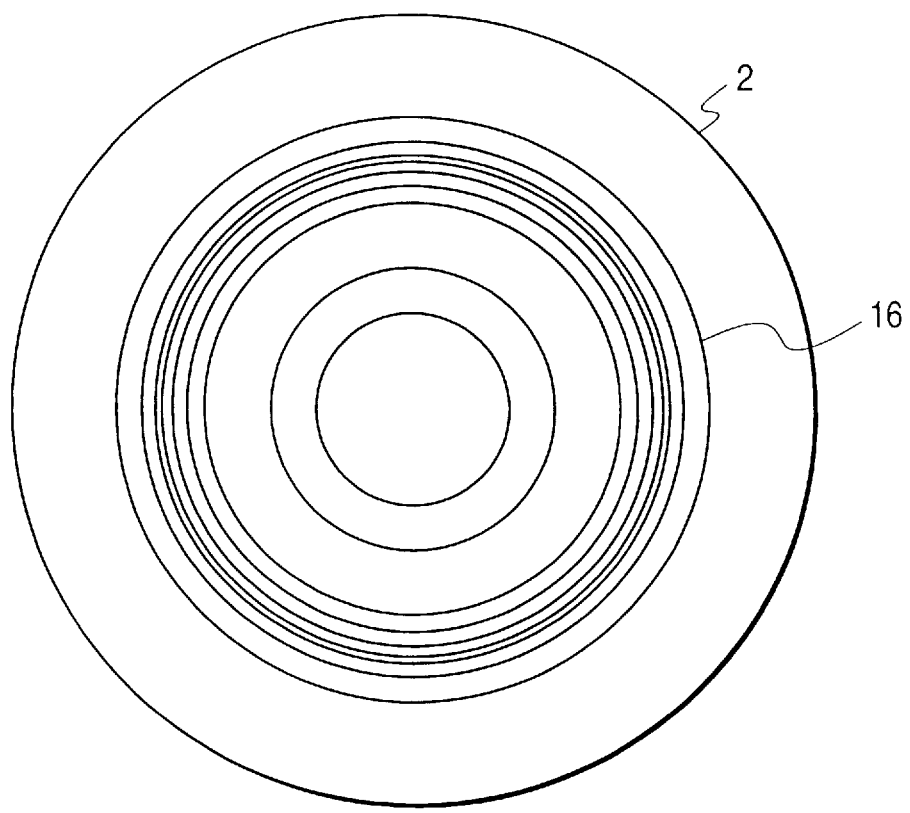
FIG. 3 is a sectional view taken along line A—A of FIG. 2 and showing the wave fronts of the electric field of the microwaves.

FIG. 3 is a section taken along line A—A of FIG. 2 and schematically shows the wave fronts of the electric field of the microwaves. In the quartz window 2, as shown in FIG. 3, the wave fronts of the electric field 16 of the microwaves are axially symmetrically enlarged so that the plasma 15 is accordingly produced with axial symmetry, i.e., uniformly in disc shapes. The wave fronts of the electric field 16 of the microwaves are always normal to the plasma 15 so that the microwaves are hardly reflected from the plasma 15. In the present embodiment, therefore, the plasma can be stably and uniformly produced to provide an effect of ensuring a uniform plasma processing with good reproducibility.

In the present embodiment, a resist, after etching, is ashed under the conditions of a gas of $O_2$+5% $CF_4$, 1 Torr, 1l/min, a microwave output of 1 KW and a temperature of the sample stage 13 of 20° C. Under these conditions, the resist over an 8-inch wafer can be removed at an ashing rate of 1 $\mu$m/min. with an excellent reproducibility and with a uniformity of ±5%. The ashing gas may be another mixture gas of $O_2$+$H_2O$ or $O_2$+$CH_3OH$. The temperature of the sample stage 13 is controlled within a range of 20° to 30° C. according to the ashing conditions.

In the present embodiment, the coaxial passage 8 and the matching chamber 9 have internal diameters of 39 mm and 80 mm, respectively; a center conductor 18 has a diameter of 16 mm; and the quartz window 2 has a thickness of 15 mm. As shown in FIG. 2, microwaves are introduced through the coaxial passage 8 and expanded toward the outer circumference of the quartz window 2 so that the structure of FIG. 2 can be conceived as kind of microwave branching passages like a T-shaped branch formed, e.g., by connecting three waveguide tubes. The stepped matching chamber 9 serves to transmit microwaves introduced from the coaxial passage 8 toward the outer circumference of the quartz window 2 without reflection.

Figure 4:
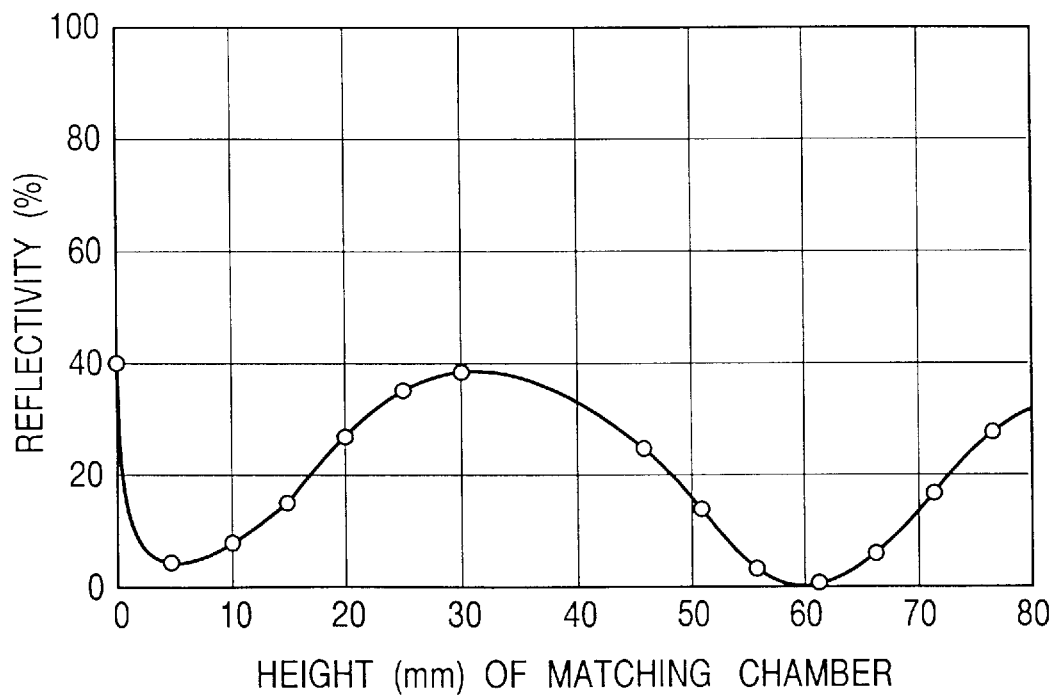
FIG. 4 is a graph illustrating a relation between the height of the matching chamber used in the first embodiment of the present invention and the reflectivity of the microwaves.

FIG. 4 illustrates the relation between the height of the matching chamber and the reflectivity of the microwave. Except for a matching chamber height of 0 mm, the reflectivity periodically changes depending upon the height of the matching chamber. The wavelength $\lambda_g$ in the coaxial passage 8 is 122 mm, and the reflectivity takes the minimum value, when the height is an integral multiple of half of the wavelength $\lambda_g$, e.g., 61 mm, and the maximum value when the height is $n\lambda_g/4$ (n is an odd positive integer), e.g., 31 mm. In the case of the present embodiment, the matching chamber 9 is given a height of 61 mm so that it transmits microwaves efficiently. As a result, a plasma 15 of a large size can be produced to provide an effect that a wafer having a large area can be uniformly ashed. The matching chamber 9 may be formed into a multi-stepped or tapered structure. However, the cylindrical shape, as in the present embodiment, provides the simplest structure and is easily designed to reduce the reflectivity.

Figure 5:
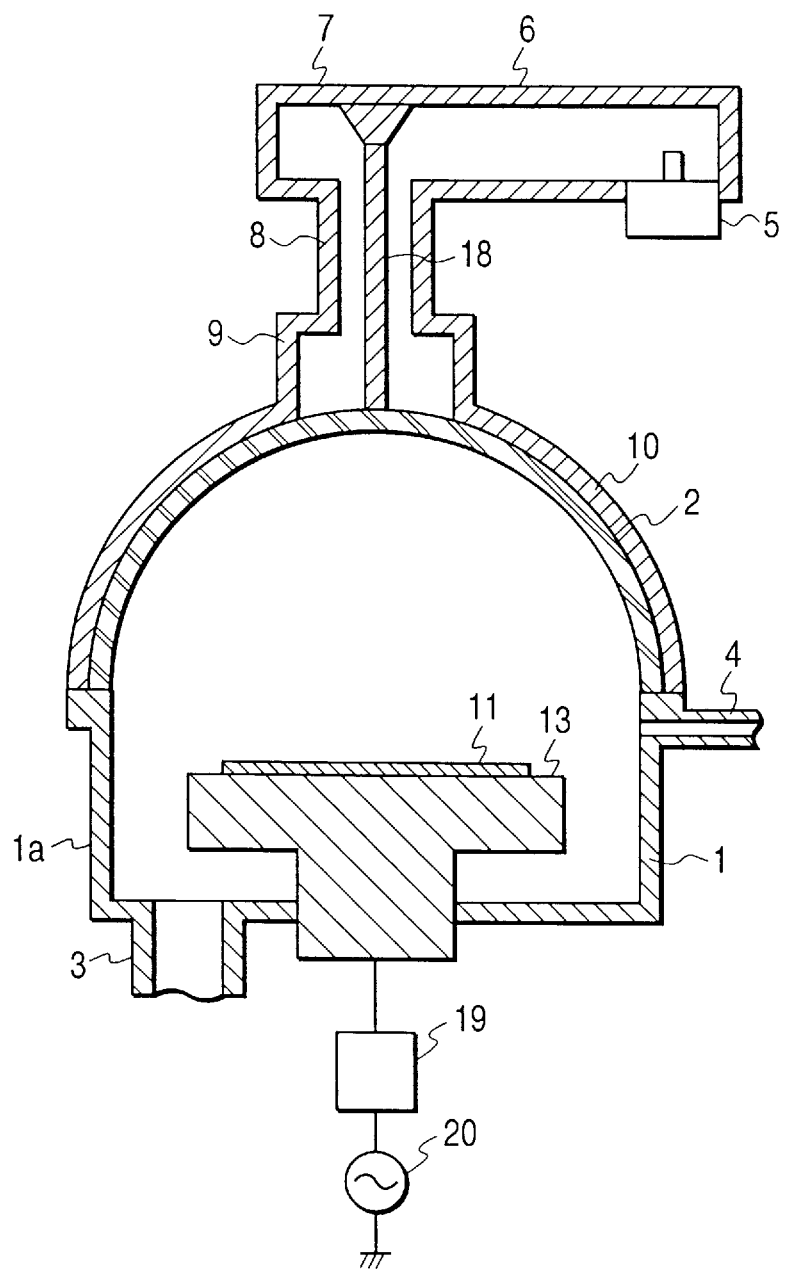
FIG. 5 is a longitudinal section showing an etching apparatus of representing second embodiment of the present invention.

FIG. 5 shows a second embodiment of the present invention. The present embodiment is applied to the etching treatment of a material such as $SiO_2$, $Si_3N_4$, Al, poly-Si, Cu, TiN or W, with a halogen gas or a flon gas such as $C_4F_8$, $CHF_3$, $Cl_2$, $BCl_3$ or HBr. In the case of the present embodiment, a semispherical quarts window 2 is employed, and a conductor plate 10 is provided in a semispherical shape along the inner face of the quartz window 2. As a result, a plasma 15 is also produced in a semispherical shape along the inner face of the quartz window 2. The sample 11 to be processed is placed on a sample stage 13 which is connected through a matching unit 19 to a high-frequency power source 20. Since the plasma 15 is produced according to the shape of the quartz window 2, the plasma distribution (i.e., the ion distribution and the radical distribution) above the face of the sample 11 can be controlled by the shape of the quartz window 2. This brings about an effect that an uniform etching process can be easily performed by the magnetic-fieldless microwave plasma which uses no magnetic field for producing the main plasma. The etching is executed under a low pressure range of several mTorrs to several hundreds mTorrs, which are different depending upon the sample 11 and the process. The shape of the quartz window 2 may be cylindrical or conical. However, the quartz window 2 forms part of the pressure container, and a semispherical shape, as in the present embodiment, can produce an effect that the quartz window 2 with the least thickness and the largest aperture can be used.

Here, the quartz window 2 is a dielectric window forming part of the processing chamber. The window should not be limited to a quartz window 2, but may be an alumina ceramic window, as long as it can transmit microwaves.

Figure 6:
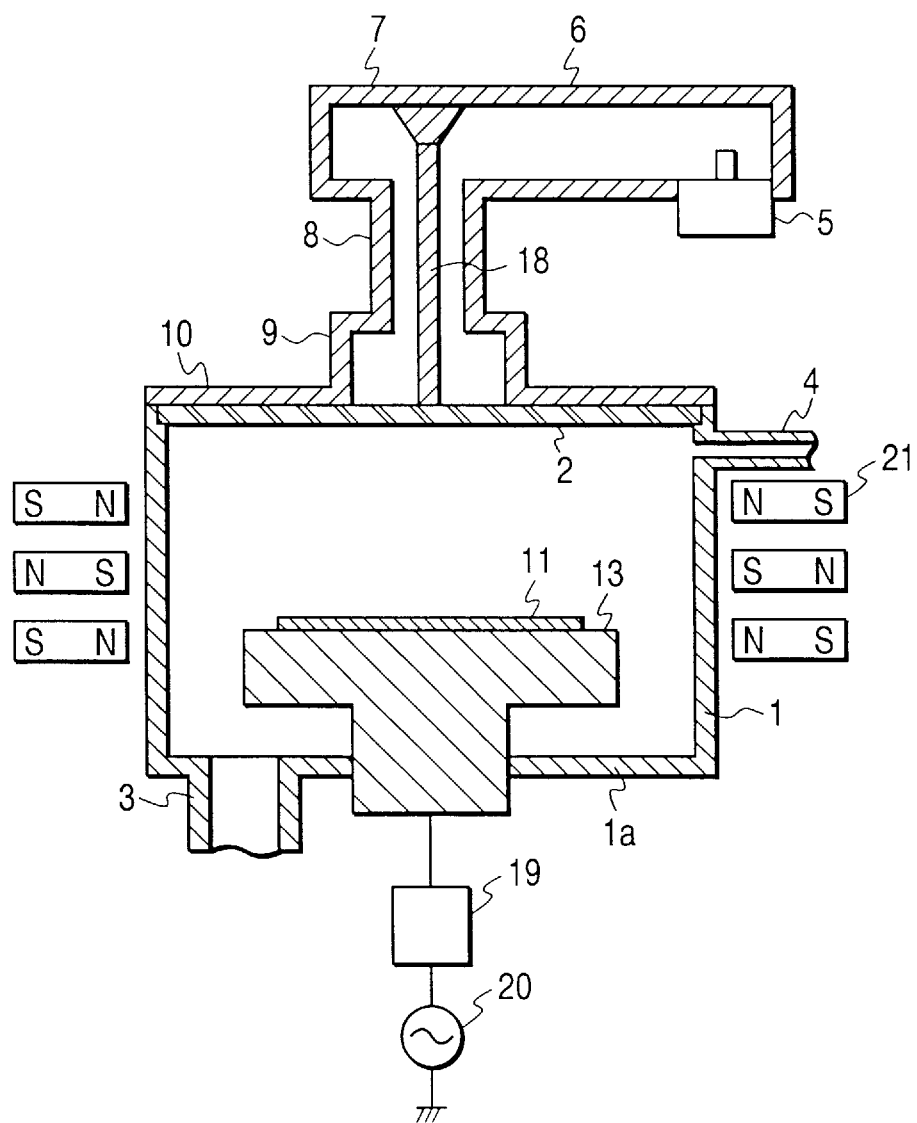
FIG. 6 is a longitudinal section showing an etching apparatus representing a third embodiment of the present invention.

FIG. 6 shows a third embodiment of the present invention. The present embodiment is also applied to etching treatment. A high-frequency voltage is applied to a sample stage 11 by a high-frequency power source 20 so that an ion sheath is formed over the sample 11 to be processed. The ions are accelerated by the electric field in the ion sheath so that they collide against the sample 11 to give it an energy, thereby to promote an etching reaction. In this etching treatment, therefore, many ions are required, and the treatment is executed under low-pressure conditions, as mentioned before. In the present embodiment, a plurality of permanent magnets 21 are arranged around the processing chamber 1 to confine the plasma by means of a magnetic field (e.g., a multi-polar magnetic field) thereby to suppress the loss in the plasma on the inner wall faces of the processing chamber 1. As a result, a large quantity of ions can be supplied to the sample 11 allow the sample 11 to be etched at a high rate. In the present embodiment, the magnetic field generated by the permanent magnets is used for confining the plasma, but not in the main plasma generating region (e.g., over the conductor plate 10).

In the foregoing embodiments, the description has been directed ashing apparatus and an etching apparatus. However, similar operations and effects can also be achieved by another plasma processing apparatus, such as a plasma CVD apparatus employing magnetic-fieldless microwave plasma, a light source, an ion source or a radial source.

According to the present invention, the coaxial passage for supplying microwaves is vertically provided over the dielectric window forming part of the processing chamber, and the conductor plate for transmitting the microwaves is provided over the dielectric window positioned on the outer circumference of the coaxial passage. As a result, the surface of the plasma so produced as to have a critical electron density $n_c$ constitutes part of the transmission passage of the microwaves, so that microwaves can be transmitted without any reflection along the dielectric window uniformly from the center to the outer circumference. As a result, there is achieved an effect that the plasma can be produced stably and uniformly to perform plasma processing with good reproducibility and uniformity.

What is claimed is:

1. A surface wave plasma processing apparatus comprising:

a processing chamber capable of being evacuated;

a gas supply device for supplying a gas into said processing chamber for producing a plasma in said processing chamber using microwaves;

a coaxial passage, for supplying microwaves, vertically provided over a dielectric window forming part of said processing chamber; and a conductor plate, for transmitting microwaves, provided over the dielectric window which is positioned on the outer circumference of said coaxial passage.

2. A surface wave plasma processing apparatus as set forth in claim 1, further comprising a matching chamber having a stepped space provided at a joint between said coaxial passage and said dielectric window.

3. A surface wave plasma processing apparatus as set forth in claim 2, wherein said matching chamber is shaped into a cylinder which has a height several times as large as half of the wavelength $\lambda_g$ of electromagnetic waves to be transmitted in said coaxial passage.

4. A surface wave plasma processing apparatus as set forth in claim 1, 2 or 3, wherein the surface portion of the plasma to be produced forms part of the transmission passage for said microwaves.

5. A surface wave plasma processing apparatus comprising:

a processing chamber capable of being evacuated;

a gas supply device for supplying a gas into said processing chamber for producing a plasma in said processing chamber using microwaves; and means for introducing microwaves into said processing chamber through a dielectric window forming part of said processing chamber; wherein a plasma having one of a disc, semispherical and conical shape is produced in the vicinity of the surface of said dielectric window forming part of said processing chamber according to the shape of said dielectric window surface, so that said plasma having the disc, semispherical or conical shape may be increased axially symmetrically in size in accordance with an increase in the output of said microwaves.

* * * * *